United States Patent
Loh et al.

(10) Patent No.: US 8,178,939 B2
(45) Date of Patent: May 15, 2012

(54) INTERFACIAL BARRIER FOR WORK FUNCTION MODIFICATION OF HIGH PERFORMANCE CMOS DEVICES

(75) Inventors: Wei-Yip Loh, Austin, TX (US);
Prashant Majhi, Austin, TX (US);
Brian Coss, Coppell, TX (US)

(73) Assignee: Sematech, Inc., Austin, TX (US)

( * ) Notice: Subject to any disclaimer, the term of this patent is extended or adjusted under 35 U.S.C. 154(b) by 196 days.

(21) Appl. No.: 12/488,569

(22) Filed: Jun. 21, 2009

(65) Prior Publication Data

US 2010/0320510 A1 Dec. 23, 2010

(51) Int. Cl.
*H01L 29/47* (2006.01)
*H01L 29/788* (2006.01)
*H01L 29/94* (2006.01)
*H01L 29/76* (2006.01)
*H01L 29/78* (2006.01)

(52) U.S. Cl. ........ 257/471; 257/312; 257/288; 257/310; 257/E29.255

(58) Field of Classification Search .................. 257/288, 257/310, 321, 471, E29.255
See application file for complete search history.

(56) References Cited

U.S. PATENT DOCUMENTS

| | | | |
|---|---|---|---|
| 3,935,586 A | 1/1976 | Landheer et al. | 357/15 |
| 5,217,923 A | 6/1993 | Suguro | 437/200 |
| 6,303,479 B1 | 10/2001 | Snyder | 438/581 |
| 6,693,004 B1 * | 2/2004 | Halliyal et al. | 438/240 |
| 6,744,103 B2 | 6/2004 | Snyder | 257/369 |
| 6,784,035 B2 | 8/2004 | Snyder et al. | 438/167 |
| 7,176,483 B2 | 2/2007 | Grupp et al. | 257/30 |
| 7,238,567 B2 | 7/2007 | Xiong | 438/240 |
| 7,294,898 B2 | 11/2007 | Snyder et al. | 257/453 |
| 2007/0026590 A1 * | 2/2007 | Snyder et al. | 438/167 |

* cited by examiner

*Primary Examiner* — Luan C Thai
(74) *Attorney, Agent, or Firm* — Fulbright & Jaworski L.L.P.

(57) ABSTRACT

A semiconductor structure may include a semiconductor bulk region with a gate stack on the semiconductor bulk region. The source region and the drain region in the semiconductor bulk region may be located on opposing sides of a channel region below the gate stack. An interfacial layer coupled to the channel region may modify a workfunction of a metal-semiconductor contact. In a MOSFET, the metal-semiconductor contact may be between a metal contact and the source region and the drain region. In a Schottky barrier-MOSFET, the metal-semiconductor contact may be between a silicide region in the source region and/or the drain region and the channel region. The interfacial layer may use a dielectric-dipole mitigated scheme and may include a conducting layer and a dielectric layer. The dielectric layer may include lanthanum oxide or aluminum oxide used to tune the workfunction of the metal-semiconductor contact.

18 Claims, 11 Drawing Sheets

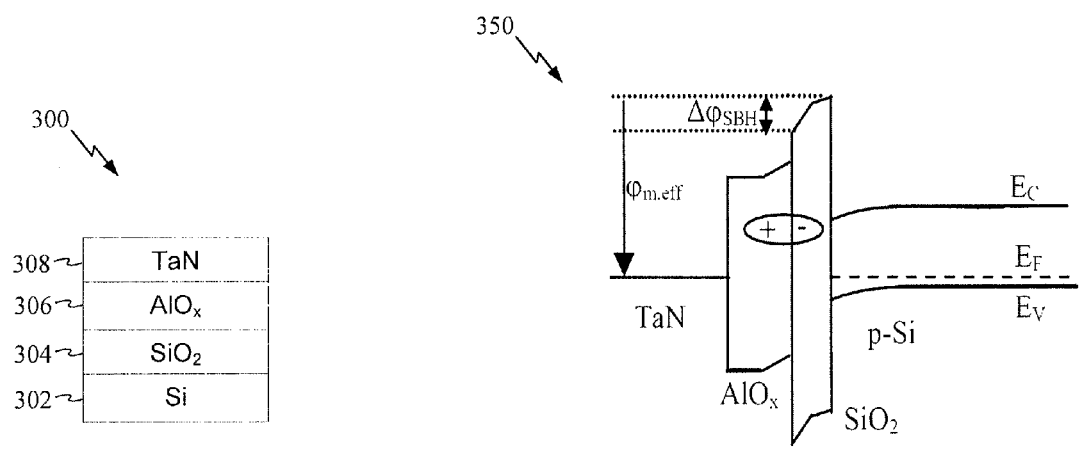
FIG. 3A                    FIG. 3B
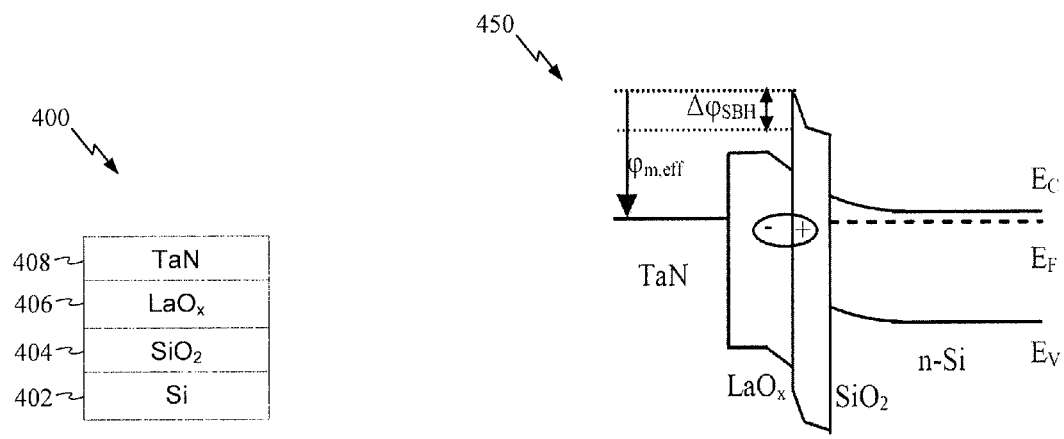
FIG. 4A                    FIG. 4B

INTERFACIAL BARRIER FOR WORK FUNCTION MODIFICATION OF HIGH PERFORMANCE CMOS DEVICES

BACKGROUND OF THE INVENTION

1. Field of the Invention

The present disclosure generally relates to semiconductor devices. More specifically, the present disclosure relates to workfunction tuning in CMOS devices.

2. Description of Related Art

Integrated circuits (ICs) are combinations of transistors and other components fabricated on wafers. Commonly, these wafers are semiconductor materials, and, in particular, silicon. Recently, transistors sizes have reduced in size to 45 nm and are continuing to shrink to 32 nm. The semiconductor industry remains focused on further reducing transistor size, however new challenges arrive with each size reduction.

Contacts to transistors in the ICs typically include materials with high conductance that allow signals to pass unimpeded from one destination to another. However, the transistors themselves are semiconductor devices, which may have a lower conductivity. Conventionally, metal-oxide-semiconductor field effect transistors (MOSFETs) are used in ICs. A MOSFET is often built on a p-doped or n-doped semiconductor bulk region and include regions of doped material referred to as a source or drain region. The bulk region between the source and drain is commonly referred to as a channel. Above the channel a gate stack is used to control current in the channel. For example, application of a suitable voltage to the gate with respect to the source inverts the region near the gate in the channel to provide carries of similar polarity to the source and drain regions allowing a flow of current from the source to drain. That is, the gate-source voltage controls, in part, the current flow through the channel referred to a drive current.

As transistor sizes shrink, the contact area between the source and drain regions and a metal contact for communicating with the transistor decreases proportionally. Contact resistance of the source and drain regions increases proportionally to a decrease in the contact area. Thus, smaller contact areas has led to higher contact resistances. Conventionally, the contact resistance is parasitic and degrades performance of the MOSFET. A portion of the contact resistance results from a Schottky barrier between the metal contact and the source and drain regions.

As described above, semiconductor materials often have low conductivity compared to other conducting materials. One alternative replaces the doped silicon in the source and drain regions with a conducting material such as metal, silicide, or nitride. A Schottky barrier forms at the boundary of the conducting material and the channel. The Schottky barrier has a built in barrier potential that acts as a rectifying junction similar to the diffused junction rectifier in MOSFETs with semiconductor source and drain regions as described earlier.

Replacing the semiconductor source and drain regions of low conductivity with a metal or silicide source and drain regions with higher conductivity can reduce the parasitic extension resistance. Yet further reducing parasitic resistance may be accomplished by lowering the Schottky barrier height of the MOSFET to reduce metal-semiconductor contact resistance. In both the MOSFET and SB-MOSFET, a Schottky barrier between a metal and a semiconductor reduces device performance by increasing contact resistance.

Current solutions for lowering the Schottky barrier include using dual metals, dual silicides, or interface engineering approaches. However, these approaches add significant complexity to the semiconductor manufacturing process, which increase cost and time of manufacturing.

SUMMARY OF THE INVENTION

In one embodiment, a semiconductor device may include a semiconductor bulk region. The semiconductor device may also include a gate stack on the semiconductor bulk region. In a further embodiment, the semiconductor device includes a source region formed in the semiconductor bulk region. The semiconductor device may also include a drain region formed in the semiconductor bulk region. The drain region may be formed on an opposite side of a channel region. The channel region may be disposed below the gate stack. The semiconductor device may also include an interfacial layer coupled to at least one of the source region and the drain region modifying a workfunction of a metal-semiconductor contact region.

In one embodiment, a semiconductor manufacturing method may include forming source and drain regions in a semiconductor substrate. The method may also include depositing a tunneling layer over a channel region between the source and drain regions on the semiconductor substrate. The method may further include depositing a gate electrode on the tunneling layer. The method may also include depositing spacers between the gate electrode and the source and drain regions. In a further embodiment, the method includes etching a recess in the source and drain regions. Additionally, the method may include forming an extension in the recess having an interfacial layer modifying a Schottky barrier height of an interface between the source and drain regions and the channel region.

In a further embodiment, a semiconductor manufacturing method may include forming source and drain regions in a semiconductor substrate. The method may also include depositing a tunneling layer over a channel region between the source and drain regions. The method may further include depositing a gate electrode on the tunneling layer. The method may also include depositing spacers between the gate electrode and the source and drain regions. The method may include depositing an interfacial layer on the source and drain regions modifying a workfunction at an interface of the source and drain regions. The method may also includes depositing electrical contacts coupled to the source and drain regions through the interfacial layer.

The foregoing has outlined rather broadly the features and technical advantages of the present disclosure in order that the detailed description that follows may be better understood. Additional features and advantages will be described hereinafter which form the subject of the claims of the disclosure. It should be appreciated by those skilled in the art that the conception and specific embodiments disclosed may be readily utilized as a basis for modifying or designing other structures for carrying out the same purposes of the present disclosure. It should also be realized by those skilled in the art that such equivalent constructions do not depart from the technology of the disclosure as set forth in the appended claims. The novel features which are believed to be characteristic of the disclosure, both as to its organization and method of operation, together with further objects and advantages will be better understood from the following description when considered in connection with the accompanying figures. It is to be expressly understood, however, that each of the figures is provided for the purpose of illustration and description only and is not intended as a definition of the limits of the present disclosure.

The term "coupled" is defined as connected, although not necessarily directly, and not necessarily mechanically.

The terms "a" and "an" are defined as one or more unless this disclosure explicitly requires otherwise.

The term "substantially" and its variations are defined as being largely but not necessarily wholly what is specified as understood by one of ordinary skill in the art, and in one non-limiting embodiment "substantially" refers to ranges within 10%, preferably within 5%, more preferably within 1%, and most preferably within 0.5% of what is specified.

The terms "comprise" (and any form of comprise, such as "comprises" and "comprising"), "have" (and any form of have, such as "has" and "having"), "include" (and any form of include, such as "includes" and "including") and "contain" (and any form of contain, such as "contains" and "containing") are open-ended linking verbs. As a result, a method or device that "comprises," "has," "includes" or "contains" one or more steps or elements possesses those one or more steps or elements, but is not limited to possessing only those one or more elements. Likewise, a step of a method or an element of a device that "comprises," "has," "includes" or "contains" one or more features possesses those one or more features, but is not limited to possessing only those one or more features. Furthermore, a device or structure that is configured in a certain way is configured in at least that way, but may also be configured in ways that are not listed.

Other features and associated advantages will become apparent with reference to the following detailed description of specific embodiments in connection with the accompanying drawings.

BRIEF DESCRIPTION OF THE DRAWINGS

For a more complete understanding of the present disclosure, reference is now made to the following description taken in conjunction with the accompanying drawings.

FIG. 3A is a block diagram illustrating a cross-sectional view of one embodiment of a rectifying junction having aluminum oxide as an interfacial layer.

FIG. 3B is a band diagram illustrating one embodiment of a dipole for a rectifying junction having aluminum oxide as an interfacial layer.

FIG. 4A is a block diagram illustrating one embodiment of a cross-sectional view of a rectifying junction having lanthanum oxide as an interfacial dielectric layer.

FIG. 4B is a band diagram illustrating one embodiment of a dipole for a rectifying junction having lanthanum oxide as an interfacial layer.

DETAILED DESCRIPTION

Various features and advantageous details are explained more fully with reference to the nonlimiting embodiments that are illustrated in the accompanying drawings and detailed in the following description. Descriptions of well known starting materials, processing techniques, components, and equipment are omitted so as not to unnecessarily obscure the invention in detail. It should be understood, however, that the detailed description and the specific examples, while indicating embodiments of the invention, are given by way of illustration only, and not by way of limitation. Various substitutions, modifications, additions, and/or rearrangements within the spirit and/or scope of the underlying inventive concept will become apparent to those skilled in the art from this disclosure.

Figure 1A:
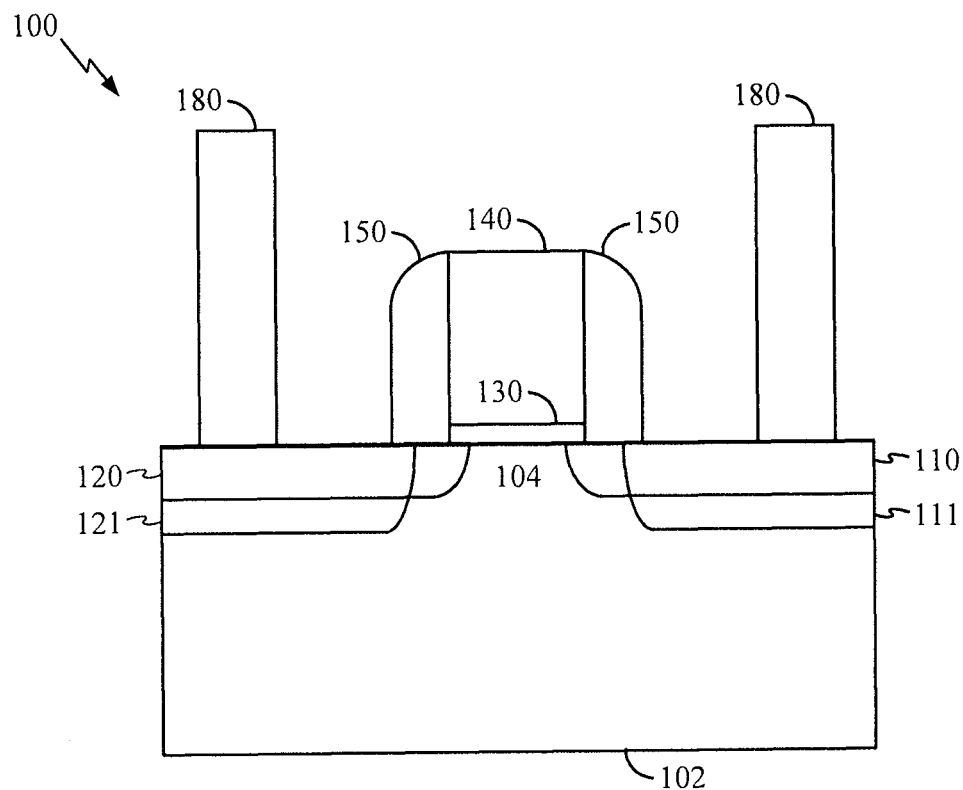
FIG. 1A is a cross-sectional view illustrating one embodiment of a conventional metal-oxide-semiconductor field effect transistor (MOSFET).

FIG. 1A is a cross-sectional view illustrating a conventional metal-oxide-semiconductor field effect transistor (MOSFET). A transistor 100 includes a bulk region 102 such as silicon, germanium, or gallium arsenide, which may also doped with n-carriers or p-carriers. Inside the bulk region 102 may be a doped source region 111 and a doped drain region 121.

To alleviate short channel effects, a lightly doped source region 110 and a lightly doped drain region 120. Formation of the regions 111, 121, 110, and 120 may be achieved using a selective self-aligned spacer 150. The regions 111, 121 may be doped with an opposite polarity from the bulk region 102. For example, if the bulk region 102 is doped with n-carriers the regions 111, 121 may be doped with p-carriers.

Between the source region 111 and the drain region 121 is a channel 104. Above the channel 104 may be an insulating layer 130 and a gate electrode 140. The gate electrode 140 may be a conductor or semiconductor that operates to control a drive current through the channel 104. Application of a suitable voltage to the gate 140 may reverse polarity of carriers in the channel 104 allowing current to flow from the source region 111 to the drain region 121. The electrical connection from the source region 110 and drain region 120 to external pads is completed by contacts 180.

Figure 1B:
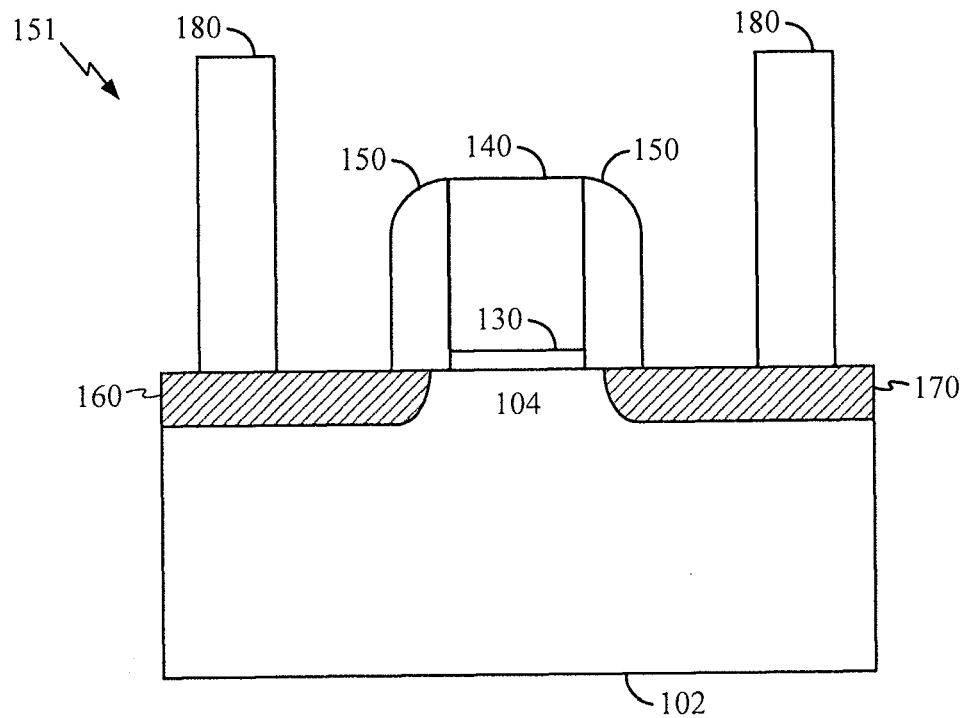
FIG. 1B is a cross-sectional view of one embodiment of a conventional Schottky barrier MOSFET.

In a Schottky barrier MOSFET (SB-MOSFET) the source region 110 and the drain region 120 may be partly or completely replaced with a metal, silicide, or nitride. FIG. 1B is a cross-sectional view of a conventional Schottky barrier MOS- FET. A silicide source region 160 and a silicide drain region 170 may be formed by depositing a metal layer on the bulk region 102, heating the bulk region 102 to a temperature that allows the metal to diffuse into the source region 160 and the drain region 170, and stripping the metal layer off.

To achieve high-performance in complementary transistors of a complementary metal oxide semiconductor (CMOS) circuit, the silicides in the source region 160 and the drain region 170 will have different workfunctions for n-type and p-type transistors. For n-type transistors, silicides with low workfunctions (e.g., $ErSi_x$, $YbSi_x$) may be used while for p-type transistors, silicides with high workfunctions (e.g NiSi, PtSi, IrSi) may be used.

One cause of parasitic contact resistance in MOSFETs may be the Schottky barrier height, which results from an energy barrier between a conductor and a semiconductor. Tuning the Schottky barrier height may further reduce parasitic contact resistance. According to one embodiment, a dielectric layer may be used in a MOSFET to create a dipole that tunes the Schottky barrier height to valence or conduction band edges. As described below, one embodiment of a MOSFET having an interfacial layer may reduce Schottky barrier height while limiting the length and cost of the semiconductor manufacturing process.

Figure 2A:
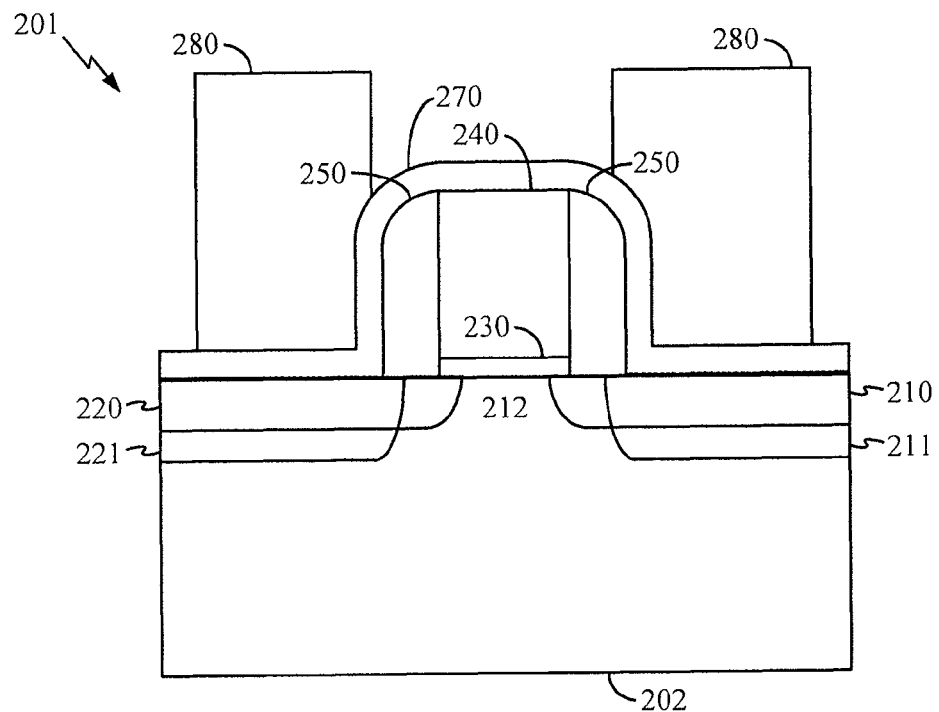
FIG. 2A is a cross-sectional view illustrating one embodiment of a transistor having an interfacial layer.

FIG. 2A is a cross-sectional view illustrating one embodiment of a transistor having an interfacial layer according to one embodiment. A transistor 201 includes a bulk region 202, which may be a semiconductor material such as silicon, germanium, or gallium arsenide. The bulk region 202 may also be doped with n-carriers or p-carriers. Inside the bulk region 202 there may be a source region 211 and a drain region 221.

To alleviate short channel effects, a lightly doped source 210 and lightly doped drain 220 region may be formed in the bulk region 202. The formation of the regions 211, 221, 210, and 220 may be achieved using a selective self-aligned spacer material 250. The regions 211, 221, 220, 210 may be doped with an opposite polarity from the bulk region 202. For example, if the bulk region 202 is doped with n-carriers the regions 211, 221, 220, 210 may be doped with p-carriers.

Between the source region 211 and the drain region 221 is a channel 212. Above the channel 212 may be a gate stack including a tunneling layer 230 and a gate electrode 240. The gate electrode 240 may be a conductor or semiconductor that operates to control a drive current through the channel 212. Application of a suitable voltage to the gate electrode 240 may reverse polarity of carriers in the channel 212 allowing current to flow from the source region 211 to the drain region 221.

An interfacial layer 270 couples the source region 211 and the drain region 221 to contacts 280. The interfacial layer 270 may include, for example, a high-K dielectric layer such as lanthanum oxide or aluminum oxide. The interfacial layer 270 may also include a conducting electrode coupled to the high-K dielectric layer such as tantalum nitride.

The interfacial layer 270 modifies a workfunction at the metal-semiconductor interface of the contact 280 and the source region 211 and the drain region 221. Modifying the workfunction reduces parasitic resistance resulting from a metal-semiconductor interface.

Figure 2B:
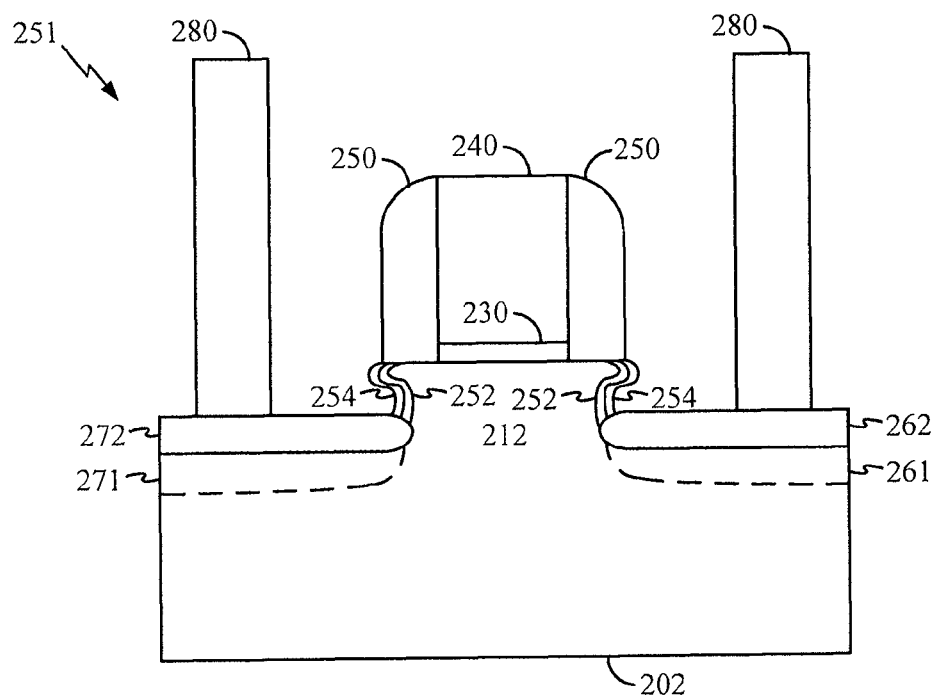
FIG. 2B is a cross-sectional view illustrating one embodiment of a Schottky transistor having an interfacial layer.

FIG. 2B is a cross-sectional view illustrating one embodiment of a Schottky transistor having an interfacial layer according to one embodiment. A SB-MOSFET 251 includes the bulk region 202. In the bulk region 202 may be a source region 261 and a drain region 271. A silicidation process may form a silicide source region 262 and a silicide drain region 272. The regions 262, 272 may be, for example, nickel silicide.

An interfacial layer 252 may be coupled to each of the silicide source region 262 and the silicide drain region 272 and may include an electrode 254 abutting on an interfacial layer 252. The interfacial layer 252 may be a high-K dielectric such as, for example, lanthanum oxide or aluminum oxide. The electrode 254 may be conductor such as, for example, metal, metal nitride, or silicide. According to another embodiment, the interfacial layer 252 may include dopant segregation, which may be doped with another carrier with dopant diffusion through the electrode 254 or with an ion-implantation process. The characteristics of the interfacial layer 252 may be engineered to achieve workfunction tuning of the Schottky extension.

Workfunction tuning as described below may allow a single SB-MOSFET structure to be implemented in both NMOS and PMOS devices. That is, workfunction tuning matches the inverted channel conduction energy to the Fermi level of a conducting material coupled to the channel. For example, in an off state, the energy barrier between the conducting material and the channel is large, and in an on state, the energy barrier between the conducting material and the channel is small.

For example, in a NMOS device the channel 212 may be p-doped silicon and in a PMOS device the channel 212 may be n-doped silicon. The energy levels for charge conduction in p-doped silicon and n-doped silicon are different. Therefore, to minimize Schottky barrier height, and thus parasitic contact resistance, energy levels may be modified through workfunction tuning. Workfunction tuning may use a different material for the interfacial layer 252 for NMOS and PMOS devices.

The material of the interfacial layer 252 and the electrode 254 may be chosen to closely match the energy level in the inverted channel 212 and the regions 210, 220. According to one embodiment, the interfacial layer 252 may provide additional electric field to form a dipole that modifies energy band alignment.

In the case of the channel 212 having p-doped silicon, the interfacial layer 252 may include lanthanum oxide ($LaO_x$). Lanthanum oxide may create a negative dipole that tunes a Schottky barrier height of the 210, 220 regions more n-type. In the case of the channel 212 having n-doped silicon, the interfacial layer 252 may include aluminum oxide ($AlO_x$). Aluminum oxide may create a positive dipole that tunes a Schottky barrier height of the regions 210, 220 more p-type. In other cases, the interfacial layer 252 may be chosen from other materials that tune the Schottky barrier height for different materials in or doping levels in the channel 212 or different materials in the regions 210, 220.

According to one embodiment, an additional oxide layer may be deposited between the interfacial layer and the channel. The additional oxide layer may be a dielectric with low permittivity to de-pin the Fermi level of the gate electrode from a channel region of the MOSFET. In one case, the additional oxide layer is a silicon oxide layer grown through steam-generation. In this case, the silicon oxide may be wet etched to a desired thickness using wet and/or dry etching processes and the dielectric interface layer and metal layer deposited above.

In one embodiment, the contacts 280 may be copper and the electrode 254 may be tantalum nitride. In this embodiment the contacts 280 contact the electrode 254. Tantalum nitride may act as a barrier to diffusion of copper into the channel 212. Thus, copper may be prevented from diffusing into the regions 220, 210 or the channel 212 resulting in a lower likelihood of device failure in the SB-MOSFET 251.

Turning now to FIG. 3A and FIG. 3B, the case of aluminum oxide used as an interfacial layer is described further. FIG. 3A is a block diagram illustrating a cross-sectional view of one embodiment of a rectifying junction having aluminum oxide as an interfacial layer according to one embodiment. A rectifying junction 300 may be used in a SB-MOSFET as described with reference to FIG. 2. The rectifying junction 300 includes a p-doped silicon layer 302 followed by a silicon dioxide layer 304. Following the silicon dioxide layer 304 is an aluminum dioxide layer 306 and a tantalum nitride layer 308. An electric field forms across the silicon dioxide layer 304 and the aluminum dioxide layer 306 creating a dipole. As shown below with reference to FIG. 3B, the dipole may result in the Schottky barrier becoming more p-type.

FIG. 3B is a band diagram illustrating a dipole for one embodiment of a rectifying junction having aluminum oxide as an interfacial layer according to one embodiment. A graph 350 illustrates the effect of the dipole on Schottky barrier height, $\Delta\phi_{SBH}$.

Turning now to FIG. 4A and FIG. 4B, the case of lanthanum oxide used as an interfacial layer is described further. FIG. 4A is a block diagram illustrating a cross-sectional view of one embodiment of a rectifying junction having lanthanum oxide as an interfacial dielectric layer according to one embodiment. A rectifying junction 400 may be used in a SB-MSOFET as described above with reference to FIG. 2. The rectifying junction 400 includes a n-doped silicon layer 402 followed by a silicon dioxide layer 404. Following the silicon dioxide layer 404 is a lanthanum oxide layer 406 and a tantalum nitride layer 408. An electric field may form across the silicon dioxide layer 404 and the lanthanum oxide layer 406 creating a dipole. As shown below with reference to FIG. 4B, the dipole may result in the Schottky barrier becoming more n-type.

FIG. 4B is a band diagram illustrating a dipole for one embodiment of a rectifying junction having lanthanum oxide as an interfacial layer according to one embodiment. A graph 450 illustrates the effect of the dipole on Schottky barrier height, $\Delta\phi_{SBH}$.

Figure 5A:
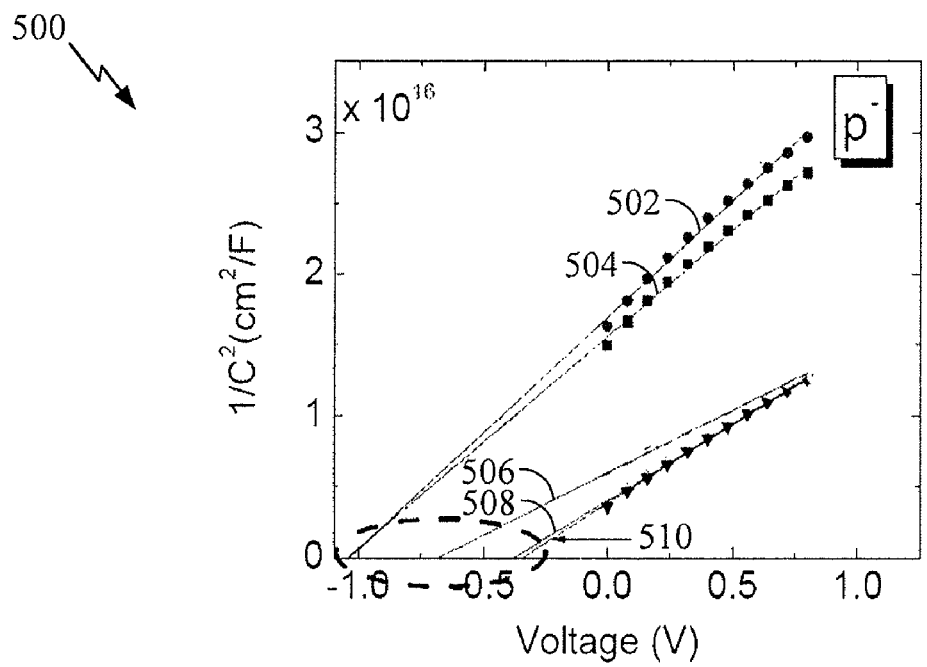
FIG. 5A is a graph illustrating one embodiment of a $1/C^2$ plot for aluminum oxide and lanthanum oxide on p-type silicon.

FIG. 5A is a graph illustrating a $1/C^2$ plot for aluminum oxide and lanthanum oxide on p-type silicon according to one embodiment. A graph 500 is obtained by a capacitance-voltage measurement of dipole mitigated tantalum nitride on lightly doped p-Si and used to calculate the Schottky barrier height. A line 502 is a capacitance-voltage measurement curve for a rectifying junction containing a 20 Angstom lanthanum oxide layer. A line 504 is a capacitance-voltage measurement curve for a rectifying junction containing a 12 Angstrom lanthanum oxide layer. A line 506 is a capacitance-voltage measurement curve for p-type silicon-metal contact in the absence of interfacial dielectrics. A line 508 is a capacitance-voltage measurement curve for a rectifying junction containing a 10 Angstrom aluminum oxide layer. A line 510 is a capacitance-voltage measurement curve for a rectifying junction containing a 20 Angstrom aluminum oxide layer.

A Schottky barrier height may be interpreted from each of the lines 502, 504, 508, and 510 by locating an x-intercept on the graph 500. In one case, the Schottky barrier height for rectifying junctions having a lanthanum oxide layer may be approximately 1.0 eV. In another case, the Schottky barrier height for rectifying junctions having a aluminum oxide layer is approximately 0.2 eV.

Figure 5B:
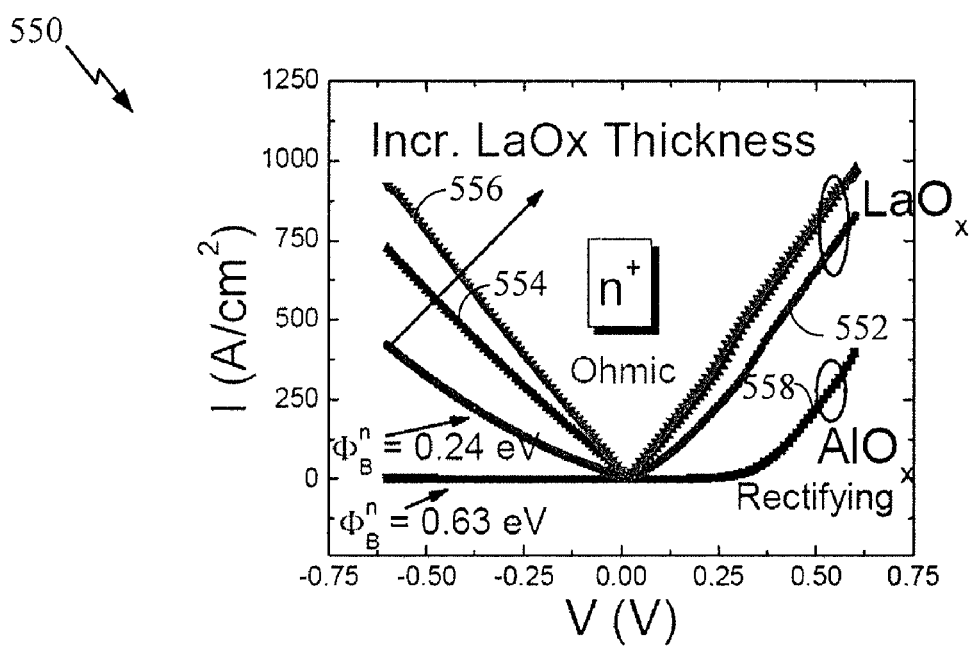
FIG. 5B is a graph illustrating one embodiment of a current plot for aluminum oxide and lanthanum oxide on n-type silicon.

FIG. 5B is a graph illustrating a current plot for aluminum oxide and lanthanum oxide on n-type silicon according to one embodiment. A graph 550 is obtained by a current-voltage measurement of dipole mitigated tantalum nitride on highly n-doped silicon. Lines 552, 554, and 556 illustrate a current-voltage measurement of a SB-MOSFET with source junctions and drain junctions having a dipole formed with lanthanum oxide of increasing thicknesses. The line 554 is a current-voltage measurement for a SB-MOSFET with a thicker lanthanum oxide layer than the line 552, and the line 556 is a current-voltage measurement for a SB-MOSFET with a thicker lanthanum oxide layer than the line 554. The lines 552, 554, and 556 indicate the source junctions and drain junctions are ohmic on highly n-doped silicon. Thus, the Schottky barrier height is assumed to be conduction band edge. A line 558 is a current-voltage measurement of a SB-MOSFET with source junctions and drain junctions having a dipole formed with aluminum oxide. The line 558 indicates the source junctions and drain junctions are rectifying on highly n-doped silicon.

Figure 6:
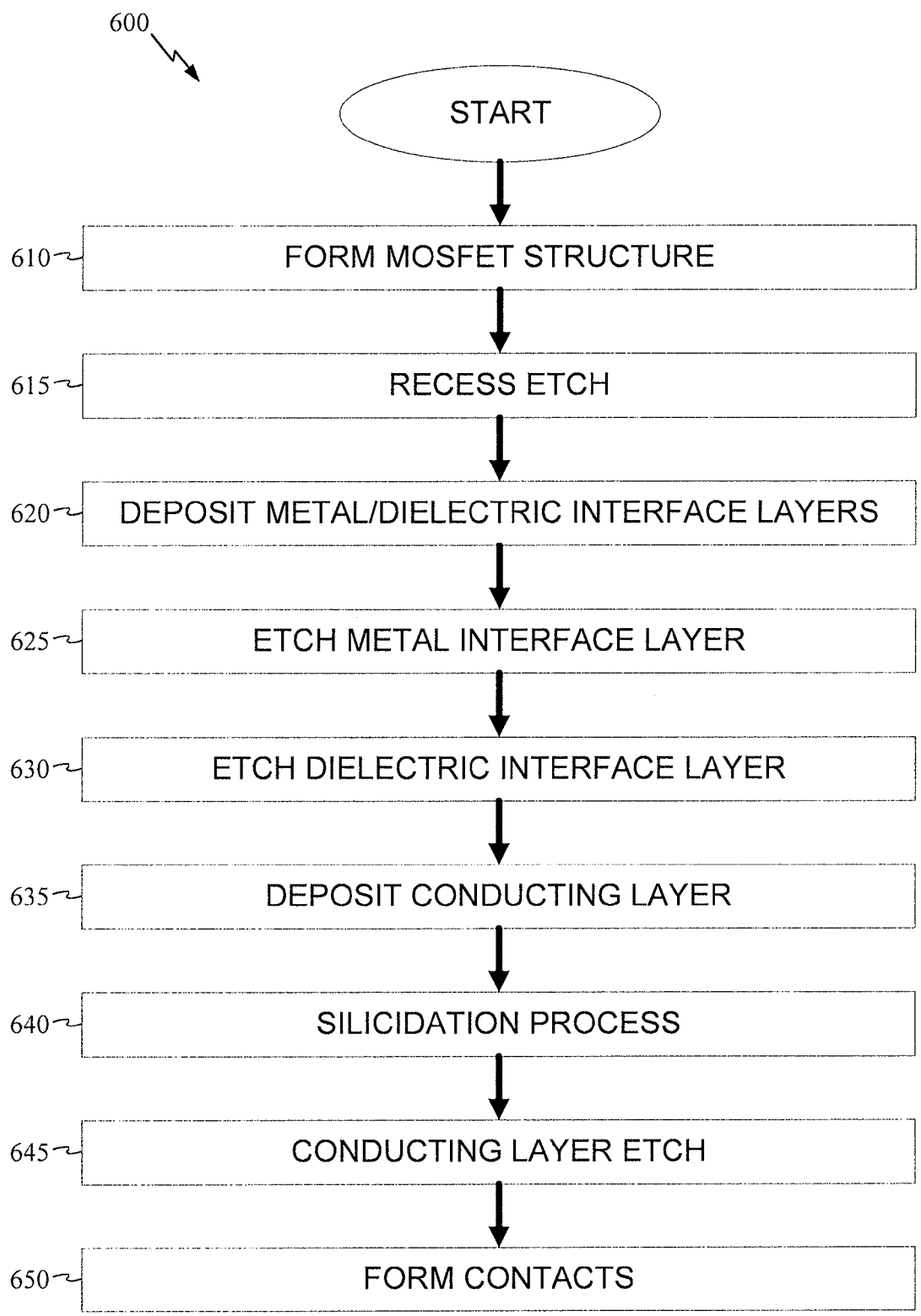
FIG. 6 is a flow chart illustrating one embodiment of a semiconductor manufacturing process for a transistor having dual dipole interfacial layers.

One embodiment of a transistor having dual dipole interfacial layers as described above may be manufactured by a semiconductor manufacturing process as described with reference to FIG. 6. FIG. 6 is a flow chart illustrating one embodiment of a semiconductor manufacturing process for a transistor having dual dipole interfacial layers according to one embodiment. A flow chart 600 begins with forming a MOSFET structure at block 610. The MOSFET structure may include a semiconductor bulk region such as silicon, source region and drain region, an insulating layer, a gate electrode, and spacers. Although manufacturing with a silicon bulk region will be described below, other suitable materials such as germanium or III-V semiconductors including gallium arsenide may be used.

At block 615, a recess etch removes a fraction of the source region and drain region. The recess etch may use wet and/or dry etching processes. At block 620 a single metal electrode and interfacial layer are deposited. Deposition may be through any suitable processes such as steam-generated oxide growth, thermal oxide growth, chemical vapor deposition, physical vapor deposition, or atomic layer deposition. The electrode may be for example, tantalum or titanium or a metal nitride such as tantalum nitride or poly-silicon. In the case of poly-silicon, the poly-silicon may be used to form a silicide such as nickel silicide. The interfacial layer may be, for example, a lanthanum-based or aluminum-based dielectric.

According to one embodiment, an oxide layer may be deposited before the interfacial layer. The oxide layer may be a dielectric with low permittivity to de-pin the Fermi level of the gate electrode from a channel region of the SB-MOSFET. In one case, the oxide layer may be a silicon oxide layer grown through steam-generation. In this case, the silicon oxide may be wet etched to a desired thickness using wet and/or dry etching processes and the interface layer and electrode deposited above.

At block 625, the electrode is partially etched using dry and/or wet etching. Etching a portion of the electrode may partially exposes the interfacial layer. At block 630, the interfacial layer is partially etched using dry and/or wet etching. According to one embodiment in which the interfacial layer may be a dielectric material, a dry etch performed before a wet etch may increase reactivity of the interfacial layer during the wet etch.

At block 635, a conformal metal layer is deposited on the MOSFET structure for use in forming a silicide in the source region and the drain region. The metal layer may be nickel, cobalt, titanium, platinum, or other ternary metals and deposited by sputtering or other suitable deposition processes. At block 640, a silicidation process is performed. According to one embodiment, silicidation may be achieved by heating the silicon bulk region to high temperatures such as 300 to 800 degrees Celsius. At high temperatures the silicon bulk region may react with the conformal metal layer. That is, the metal atoms migrate into the silicon bulk region to form a metal silicide.

At block 645 a metal etch removes unreacted metal deposited at block 635 from the surface of the SB-MOSFET structure. The metal etch may be a wet etch with oxidizing chemicals such as sulphuric acid that strips off the unreacted metal. Only portions of the conformal metal layer deposited over the source region and/or the drain region may form silicide and be left behind by the wet etch. Thus, according to one embodiment, the silicide layer is self-aligned and does not use additional lithography steps. At block 650, metal contacts are formed to connect to the source region and the drain region enabling communication between the SB-MOSFET structure and external circuitry.

One embodiment of a semiconductor manufacturing process for manufacturing a SB-MOSFET having dual dipole interfacial layers will be described in further detail with reference to FIGS. 7A-7G. FIGS. 7A-7G are cross-sectional views illustrating one embodiment of a semiconductor manufacturing process for a MOSFET having dual dipole interfacial layers according to one embodiment.

Figure 7A:
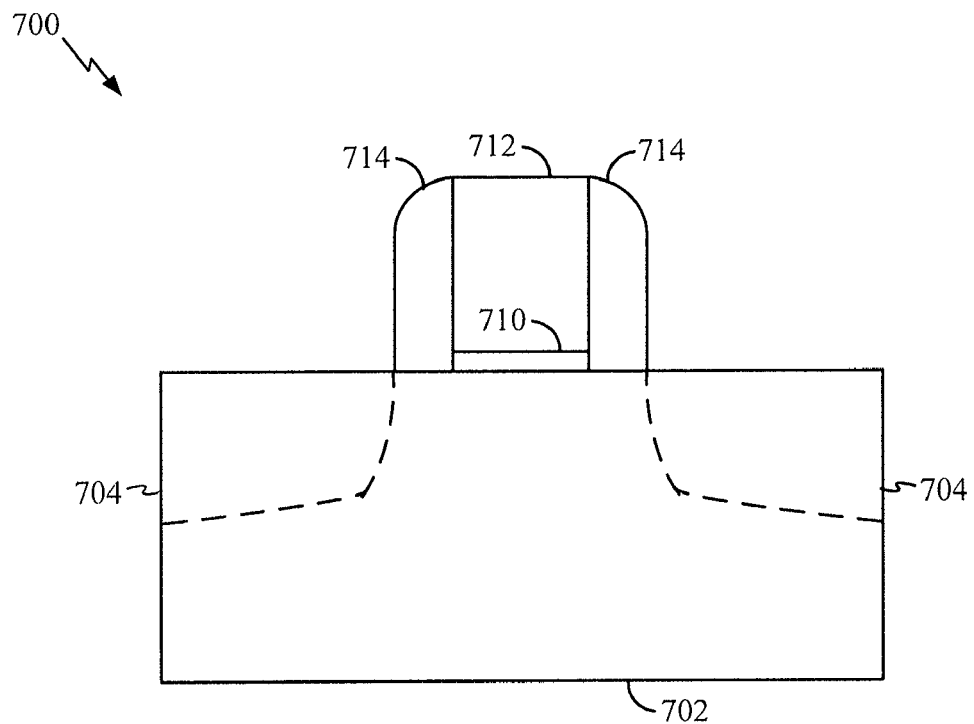
FIG. 7A is a cross-sectional view illustrating one embodiment of a MOSFET structure.

FIG. 7A is a cross-sectional view illustrating a MOSFET structure according to one embodiment. A MOSFET 700 includes a semiconductor bulk region 702 having a doped source region 703 and drain region 704. The semiconductor bulk region 702 may be, for example, silicon. As described herein, the source region 703 and drain region 704 may be interchangeable depending on the configuration of the transistor with external power equipment. The source region 703 and the drain region 704 are described in the depicted configuration for non-limiting illustrative purposes only. On the semiconductor bulk region 702 between the source region 703 and the drain region 704 may be a tunneling layer 710. Coupled to the tunneling layer 710 may be a gate electrode 712. Voltages applied to the gate electrode 712 may control a drive current of the MOSFET 700. For example, increasing a voltage applied to the gate electrode 712 may increase the drive current between the source region 703 and the drain region 704. A spacer 714 provides space between the tunneling layer 710 from the source region 703 and the drain region 704.

Figure 7B:
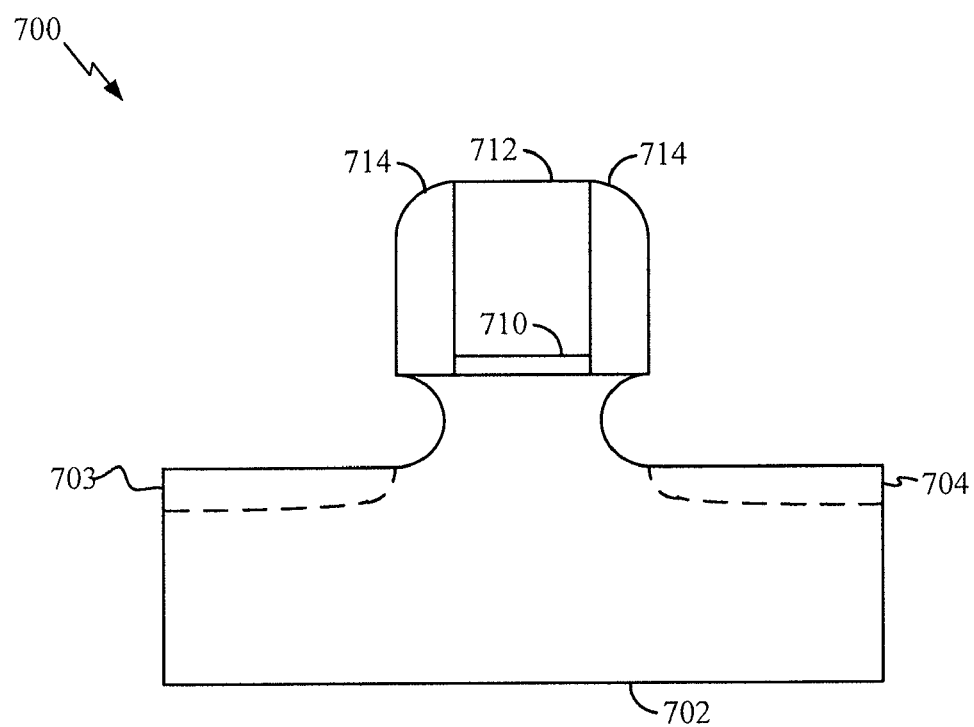
FIG. 7B is a cross-sectional view illustrating one embodiment of a MOSFET structure after a recess etch.

FIG. 7B is a cross-sectional view illustrating a MOSFET structure after a recess etch according to one embodiment. The source region 703 and the drain region 704 may be etched using wet and/or dry etching. A recess etch or trench etch may remove a portion of the source region 703 and the drain region 704.

According to one embodiment, after the recess etch a layer of dielectric may be grown on the source region 703 and the drain region 704. As For example, through steam-generation or thermal-generation a layer of silicon oxide is grown on the source region 703 and the drain region 704. In this case, the silicon oxide layer may be grown to a desired height and followed by an etch, which may thin the silicon oxide layer to a desired height.

Figure 7C:
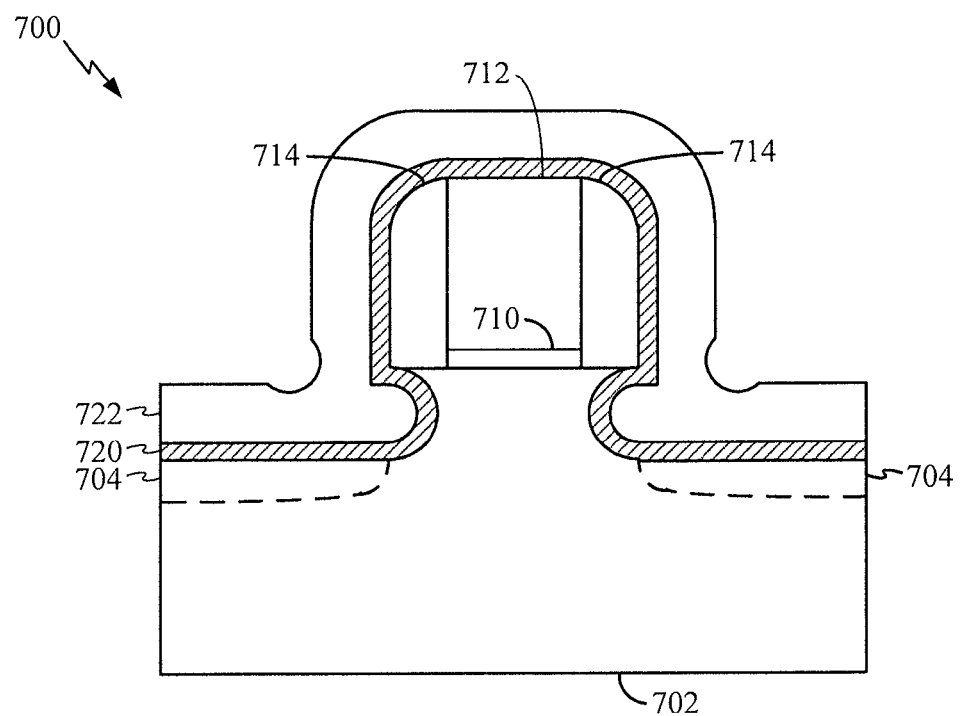
FIG. 7C is a cross-sectional view illustrating one embodiment of a MOSFET structure after deposition of conducting and dielectric layers.

FIG. 7C is a cross-sectional view illustrating a MOSFET structure after deposition of conducting and dielectric layers according to one embodiment. A dielectric layer 720 may be lanthanum oxide or aluminum oxide deposited by atomic layer deposition or other materials such as, for example, oxynitride, SiON, nitrided oxide, hafnium-based oxide, zirconium-based oxide, or other high-K dielectrics. Although the dielectric layer 720 is drawn as a single layer, the dielectric layer 720 may also include several layers. The dielectric layer 720 may create a dipole that modifies the Schottky barrier height at the source region 703 and the drain region 704. Thus, workfunction tuning may be achieved by appropriately selecting the dielectric layer 720 and the conducting layer 722.

Figure 7D:
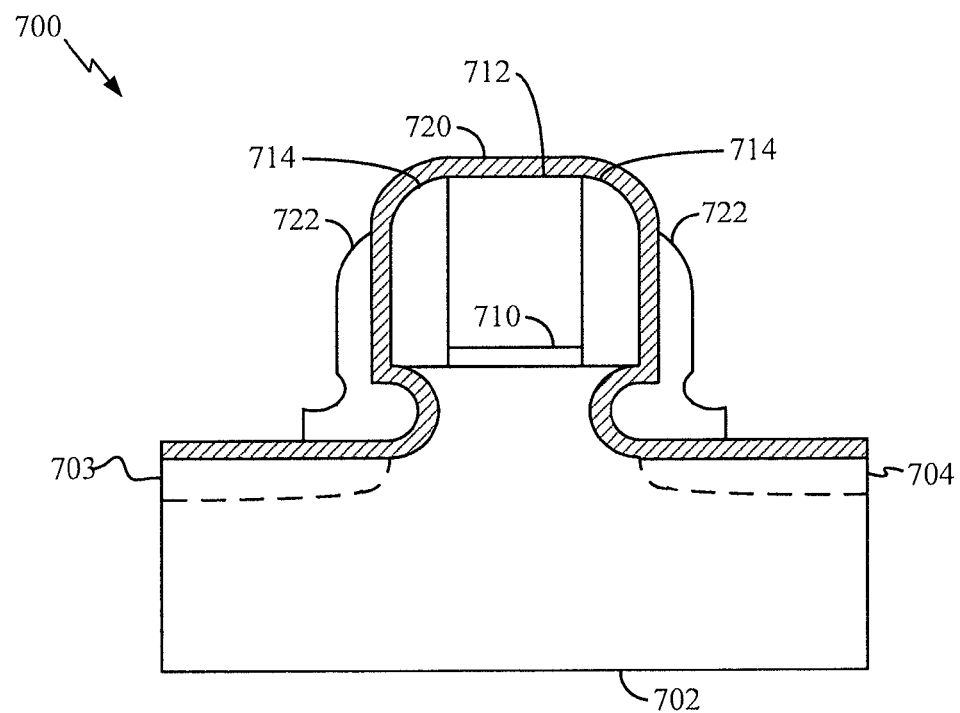
FIG. 7D is a cross-sectional view illustrating one embodiment of a MOSFET structure after etching a portion of the conducting layer.

FIG. 7D is a cross-sectional view illustrating a MOSFET structure after etching a portion of the conducting layer according to one embodiment. The conducting layer 722 is etched through wet and/or dry etching. A portion of the conducting layer 722 on the source region 703 and the drain region 704 remains after etching. The remaining portion of the conducting layer 722 may be used as a mask for etching the dielectric layer 720.

Figure 7E:
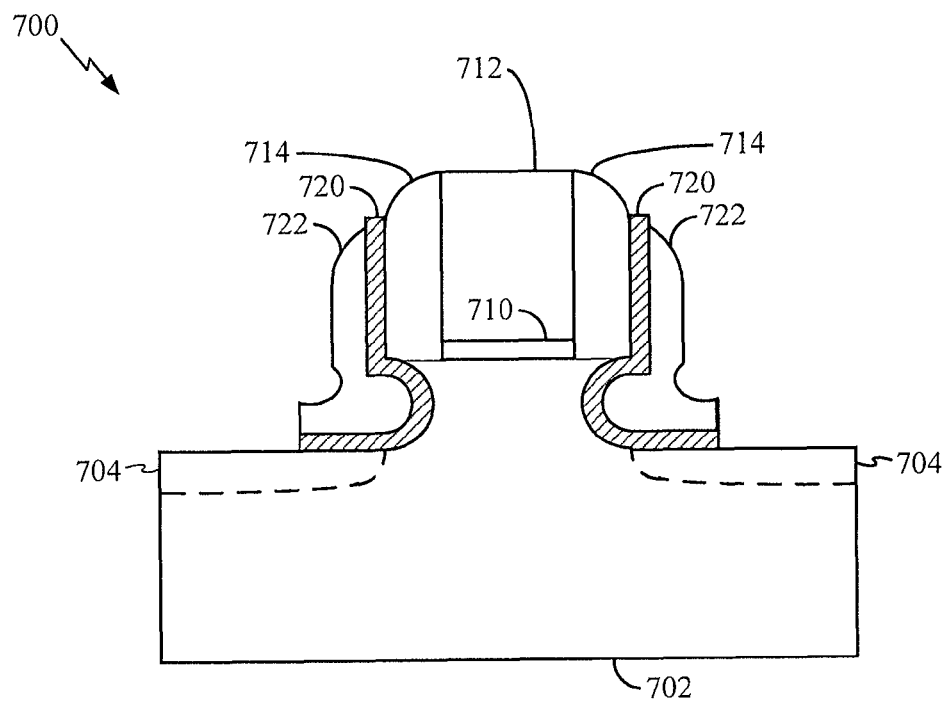
FIG. 7E is a cross-sectional view illustrating one embodiment of a MOSFET structure after etching a portion of a dielectric layer.

FIG. 7E is a cross-sectional view illustrating a MOSFET structure after etching a portion of a dielectric layer according to one embodiment. The dielectric layer 720 may be etched through dry and/or wet etching. A portion of the dielectric layer 720 may remain after etching that is masked by the conducting layer 722.

For example, if a dry etch is used, reactive ions that remove material from the dielectric layer 720 may be unable to reach portions of the dielectric layer 720 covered by the conducting layer 722. After deposition and etching of the dielectric and metal interfacial layers, a silicide may be formed as a source region 703 and a drain region 704 as described below.

According to one embodiment, a metal contact (not shown) may be coupled to the conducting layer 722. For example, if the conducting layer 722 is tantalum nitride copper may couple to the tantalum nitride without diffusion of copper into the semiconductor bulk region 702.

According to one embodiment, after etching of the metal and dielectric layers, a deep source-drain implant process may be performed. In this case, implants such as boron or arsenic may be implanted in the semiconductor bulk region 702 below the source region 703 and the drain region 704 and junction leakage to the semiconductor bulk region 702 may be reduced.

Figure 7F:
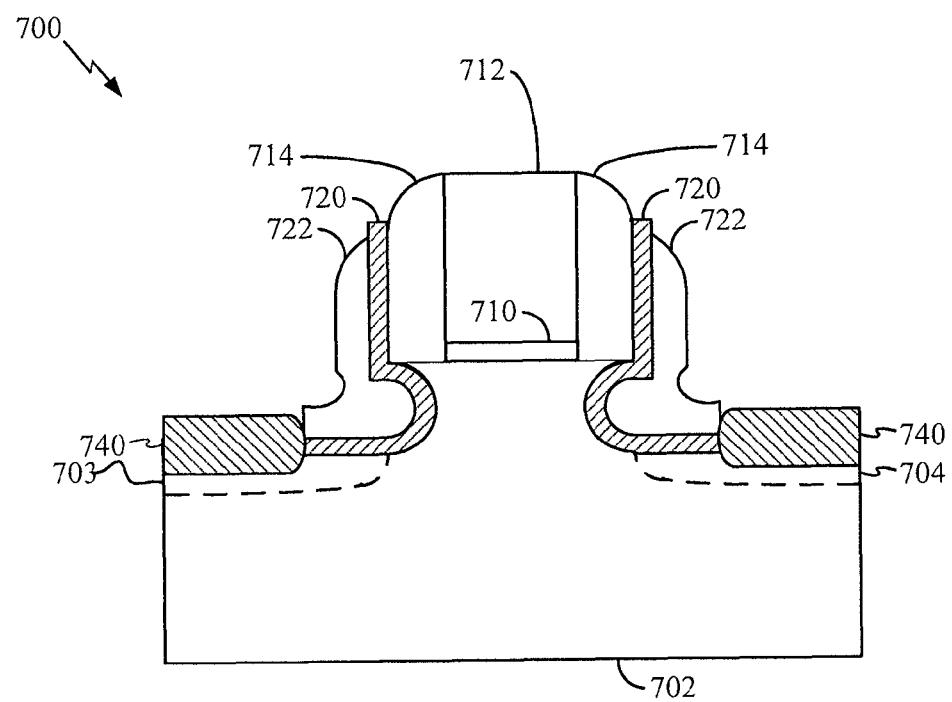
FIG. 7F is a cross-sectional view illustrating one embodiment of a MOSFET structure after a silicidation process.

FIG. 7F is a cross-sectional view illustrating a MOSFET structure after a silicidation process according to one embodiment. A silicidation process forms silicide regions 740 on the source region 703 and the drain region 704. The silicidation process may include depositing a conformal metal layer on the MOSFET 700 followed by an annealing process. The metal layer acts as a source of metal atoms during annealing, which allows the metal atoms to diffuse into the source region 703 and the drain region 704. During the annealing processes the MOSFET 700 may be heated to temperatures of approximately 300 to 800 degrees Celsius.

A depth of the silicide regions 740 may be controlled by altering at least one of, for example, a thickness of the metal layer, a temperature of the silicidation process, and a time of the silicidation process. Additionally, a composition of the silicide regions 740 may be controlled by altering at least one of, for example, the thickness of the metal layer, the temperature of the silicidation process, and the time of the silicidation process.

In one embodiment, the metal layer is a thin nickel layer and the silicide regions 740 may be a silicon rich nickel silicide phase such as nickel disilicide ($NiSi_2$). According to a second embodiment, the metal layer may be a thin nickel layer and the silicide regions 740 may be a nickel rich nickel silicide phase such as dinickel silicide ($Ni_2Si$). Additional phases of nickel silicide may be achieved in the silicide regions 740 such as mono-nickel silicide (NiSi).

In another embodiment, the temperature of the silicide process may be altered to vary the composition of the silicide regions 740. For example, a high temperature during the silicidation process may result in a silicon rich nickel silicide phase such as nickel disilicide ($NiSi_2$) in the silicide regions 740. Alternatively, a low temperature during the silicidation process may result in a nickel rich nickel silicide phase such as dinickel silicide ($Ni_2Si$) in the silicide regions 740.

Different phases of nickel silicide may be used, according to one embodiment, to tune the workfunction of the MOSFET 700. For example, mononickel silicide (NiSi) has a workfunction of approximately 4.6 eV. A lower workfunction may be achieved using dinickel silicide ($Ni_2Si$) or a higher workfunction may be achieved using nickel disilicide ($NiSi_2$).

Figure 7G:
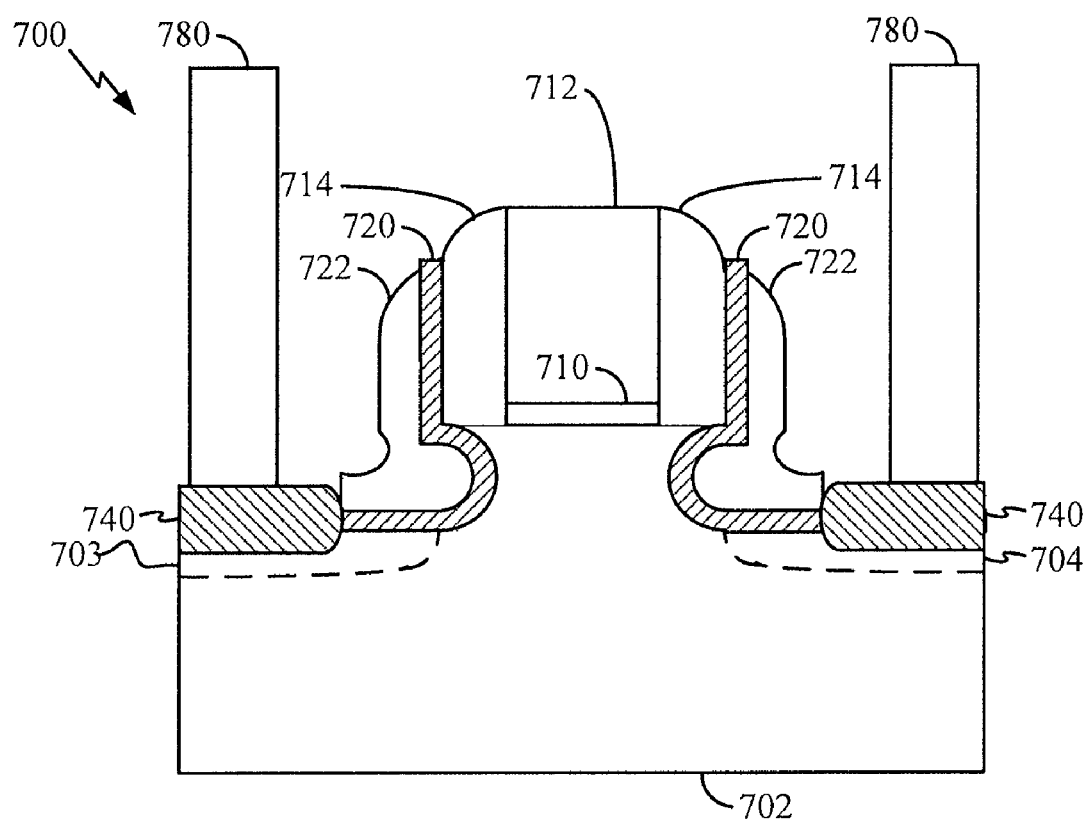
FIG. 7G is a cross-sectional view illustrating one embodiment of a MOSFET structure after formation of contacts.

FIG. 7G is a cross-sectional view illustrating a MOSFET structure after formation of contacts according to one embodiment. Contacts 780 may be formed through photolithography processes. For example, a photoresist may be deposited on the MOSFET 700 followed by exposure through a photo mask to expose a portion of the photoresist. In this case, following exposure the photoresist may be developed and contacts deposited in the openings. The photoresist may then be stripped leaving behind the contacts 780. The contacts 780 may include materials such as, for example, aluminum, copper, aluminum silicide, and aluminum silicide copper.

Figure 8:
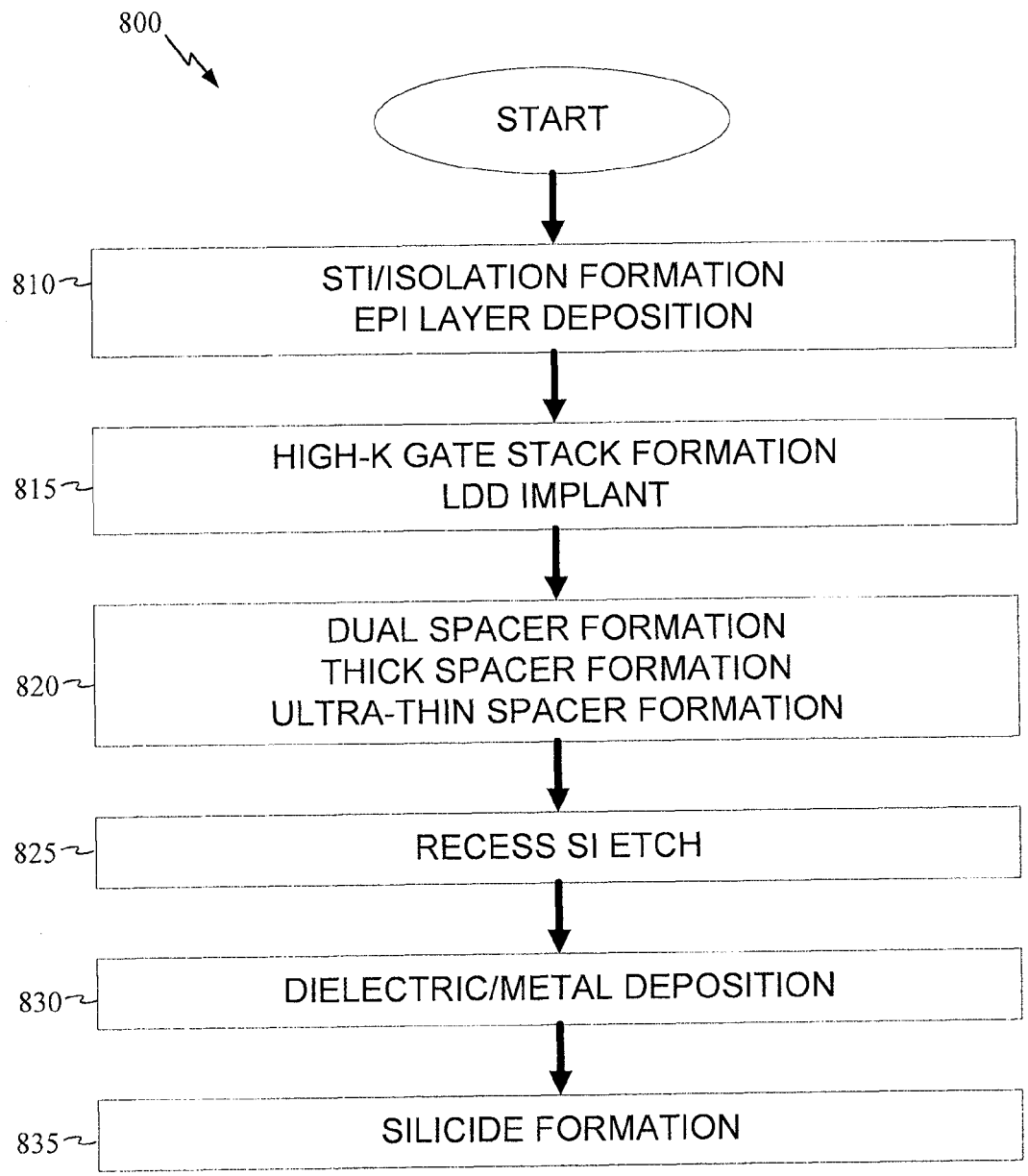
FIG. 8 is a flow chart illustrating one embodiment of a process for manufacturing of an exemplar SB-MOSFET.

FIG. 8 is a flow chart illustrating manufacturing of one embodiment of a MOSFET according to one embodiment. At box 810 STI/Isolation Formation occurs along with epitaxial layer deposition. These layers may include, for example, SiGe, Ge, or hetero-structures. At box 815, high-K gate stack formation occurs. Stack formation may also include an optional lightly doped drain (LDD) implant including dopant implant or impurity implant. At box 820 dual spacer formation, thick spacer formation, and ultra-thin spacer formation occur. The thick spacer formation may include a deep SD implant and activation. The ultra-thin spacer formation may include less than 20 nm of SiN, and a thick oxide cap. At box 825, a recess silicon etch occurs. The etch may be between 10 and 40 nm and include an oxide spacer strip. At box 830 dielectric and metal deposition occurs. The dielectric deposition may include high-k dielectrics, such as hafnium-based oxides, or $SiO_2$. The metal deposition may include, polycide deposition and etch. At box 835 silicide formation occurs. Silicide formation may include pre-cleaning in DFH to remove approximately 5 nm. Silicide formation may also include nickel deposition, rapid thermal annealing (RTA) at 250 degrees Celsius, and selective wet etching.

Advantages of the present disclosure include an abrupt shallow junction that may meet International Technology Roadmap for Semiconductors (ITRS) junction specifications and series resistance specifications. Another advantage may be low temperature processes used in manufacturing allowing low thermal stability materials in MOSFET structures, whereas conventional MOSFET manufacturing techniques may use dopant activation at temperatures exceeding 1000 degrees Celsius. Additionally, the present disclosure may be fully compatible with current silicon CMOS process technologies.

Further, short channel effects may be controlled by altering dielectric thickness or dopant control. Another advantage may be the fully self-aligned nature of the structures and reduced manufacturing demands such as additional mask layers and processes. Further, flexible source-drain material engineering may be used to tune the transistors using either dielectrics or poly-electrode engineering.

The semiconductor structures, such as a MOSFET, disclosed above may be employed in integrated circuits. For example, the MOSFET may be part of a NAND or NOR gate in a logic device such as a microprocessor. Alternatively, the MOSFET may be integrated into a memory device.

Figure 9:
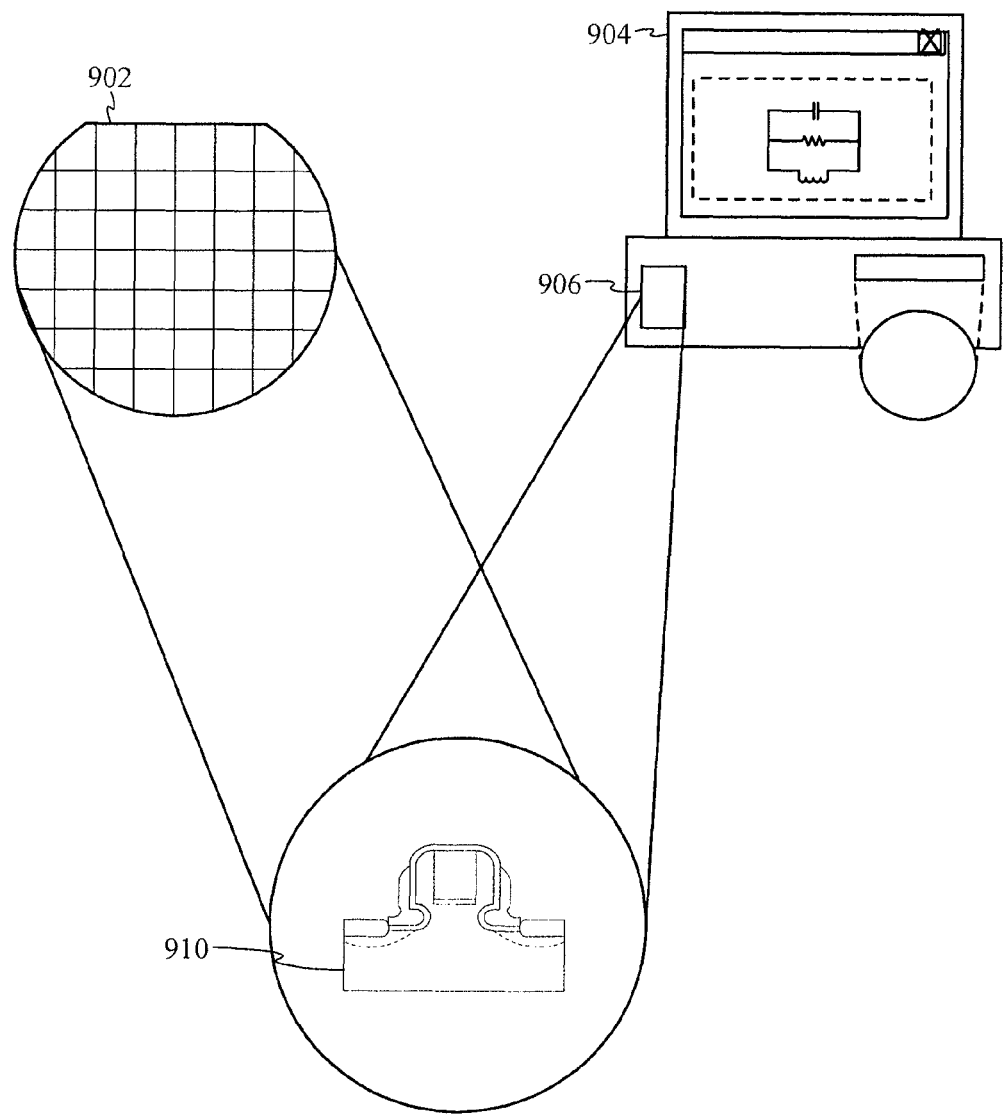
FIG. 9 is a block diagram illustrating one embodiment of an implementation of a circuit in a semiconductor wafer or an electronic device.

FIG. 9 is a block diagram illustrating implementation of a circuit in a semiconductor wafer or an electronic device according to one embodiment. In one case, a MOSFET 910 such as discussed above in FIG. 2 may be found in a wafer 902. The wafer 902 may be singulated into one or more dies that may contain the MOSFET 910. Additionally, the wafer 902 may experience further semiconductor manufacturing before singulation. For example, the wafer 902 may be bonded to a carrier wafer, a packaging bulk region, a second wafer, or transferred to another fabrication facility. Alternatively, a electronic device 904 such as a personal computer may include a memory device 906 that includes the MOSFET 910. Additionally, other parts of the electronic device 904 may include the MOSFET 910 such as a microprocessor, a digital to analog converter (DAC), an analog-to-digital converter (ADC), a graphics processing unit (GPU), a microcontroller, or a communications controller.

Although the present disclosure and its advantages have been described in detail, it should be understood that various changes, substitutions and alterations can be made herein without departing from the technology of the disclosure as defined by the appended claims. Moreover, the scope of the present application is not intended to be limited to the particular embodiments of the process, machine, manufacture, composition of matter, means, methods and steps described in the specification. As one of ordinary skill in the art will readily appreciate from the disclosure, processes, machines, manufacture, compositions of matter, means, methods, or steps, presently existing or later to be developed that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

What is claimed is:

1. A semiconductor device, comprising:
a semiconductor bulk region;
a gate stack coupled to the semiconductor bulk region;
a source region formed in the semiconductor bulk region;
a drain region formed in the semiconductor bulk region, the drain region formed on an opposite side of a channel region, the channel region being disposed below the gate stack; and
an interfacial layer coupled to at least one of the source region and the drain region, the interfacial layer having a first region comprising a first dielectric and a second region comprising a second dielectric.

2. The semiconductor device of claim 1, further comprising a silicide region on each of the source region and the drain region, the interfacial layer disposed between the silicide region and the channel region.

3. The semiconductor device of claim 2, the interfacial layer comprising a high-K dielectric.

4. The semiconductor device of claim 3, further comprising an electrode abutting the interfacial layer and coupled to the silicide region.

5. The semiconductor device of claim 4, the interfacial layer comprising lanthanum oxide and the semiconductor bulk region comprising n-doped silicon.

6. The semiconductor device of claim 4, the interfacial layer comprising aluminum oxide and the semiconductor bulk region comprising p-doped silicon.

7. The semiconductor device of claim 4, the electrode comprising at least one of a metal, a metal nitride, and a silicide.

8. The semiconductor device of claim 1, further comprising a conducting layer on the interfacial layer and a conducting contact coupled to the conducting layer.

9. The semiconductor device of claim 8, the conducting layer comprising tantalum nitride and the conducting contact comprising copper.

10. The semiconductor device of claim 1, the interfacial layer comprising dopant segregated silicon.

11. The semiconductor device of claim 1, wherein the first region and the second region form a dipole.

12. The semiconductor device of claim 1, wherein the dipole is configured to modify a workfunction of a metal-silicon interface region.

13. The semiconductor device of claim 11, wherein the dipole is configured to be a positive dipole.

14. The semiconductor device of claim 11, wherein the dipole is configured to be a negative dipole.

15. The semiconductor device of claim 1, wherein the first region comprises a metal-oxide material.

16. The semiconductor device of claim 15, wherein the first region comprises aluminum oxide.

17. The semiconductor device of claim 15, wherein the first region comprises lanthanum oxide.

18. The semiconductor device of claim 1, wherein the second region comprises silicon dioxide.

* * * * *